United States Patent
Nakashiba et al.

(10) Patent No.: US 12,394,759 B2
(45) Date of Patent: Aug. 19, 2025

(54) SEMICONDUCTOR DEVICE AND CIRCUIT DEVICE

(71) Applicant: RENESAS ELECTRONICS CORPORATION, Tokyo (JP)

(72) Inventors: Yasutaka Nakashiba, Tokyo (JP); Hiroshi Yanagigawa, Tokyo (JP); Kazuhisa Mori, Tokyo (JP); Toshiyuki Hata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 409 days.

(21) Appl. No.: 18/059,646

(22) Filed: Nov. 29, 2022

(65) Prior Publication Data

US 2023/0246002 A1 Aug. 3, 2023

(30) Foreign Application Priority Data

Feb. 3, 2022 (JP) .................................. 2022-015407

(51) Int. Cl.
*H01L 25/07* (2006.01)
*H01L 23/00* (2006.01)
(Continued)

(52) U.S. Cl.
CPC ............ *H01L 25/074* (2013.01); *H01L 24/32* (2013.01); *H01L 24/40* (2013.01); *H01L 24/73* (2013.01);
(Continued)

(58) Field of Classification Search
CPC ........ H01L 25/074; H01L 24/32; H01L 24/40
See application file for complete search history.

(56) References Cited

U.S. PATENT DOCUMENTS 8,063,620 B2 * 11/2011 Hosokawa ........... H03K 17/687
323/222
8,138,598 B2 * 3/2012 Shiraishi ................. H01L 24/84
257/676

(Continued)

FOREIGN PATENT DOCUMENTS

CN 205488094 U * 8/2016
CN 205488121 U * 8/2016

(Continued)

OTHER PUBLICATIONS

Office Action dated May 27, 2025, issued in corresponding Japanese Application No. 2022-015407, 9 pages.

*Primary Examiner* — Laura M Menz
(74) *Attorney, Agent, or Firm* — Rimon P.C.

(57) ABSTRACT

A semiconductor device includes: a first semiconductor chip including a first MOSFET of n-type and a first parasitic diode; and a second semiconductor chip including a second MOSFET of n-type and a second parasitic diode. A first source electrode and a first gate wiring are formed in a first front surface of the first semiconductor chip, and a first drain electrode is formed in a first back surface of the first semiconductor chip. A second source electrode and a second gate wiring are formed in a second front surface of the second semiconductor chip, and a second drain electrode is formed in a second back surface of the second semiconductor chip. The first front surface and the second front surface face each other such that the first source electrode and the second source electrode are in contact with each other via a conductive paste.

14 Claims, 12 Drawing Sheets

(51) Int. Cl.
*H10D 30/66* (2025.01)
*H10D 84/00* (2025.01)
*H02M 7/537* (2006.01)

(52) U.S. Cl.
CPC ......... *H10D 30/668* (2025.01); *H10D 84/144* (2025.01); *H01L 2224/32145* (2013.01); *H01L 2224/40227* (2013.01); *H01L 2224/73263* (2013.01); *H01L 2924/13091* (2013.01); *H02M 7/537* (2013.01)

(56) References Cited

U.S. PATENT DOCUMENTS

| | | | | |
|---|---|---|---|---|
| 8,305,060 | B2* | 11/2012 | Hosokawa | H03K 17/063 323/222 |
| 8,519,533 | B2* | 8/2013 | Shiraishi | H01L 24/84 257/723 |
| 8,592,904 | B2* | 11/2013 | Shiraishi | H10D 84/0149 257/341 |
| 8,853,846 | B2* | 10/2014 | Shiraishi | H10D 64/62 257/676 |
| 8,884,309 | B2* | 11/2014 | Miura | H10D 30/669 257/77 |
| 9,024,423 | B2* | 5/2015 | Muto | H01L 25/074 257/E27.137 |
| 9,153,686 | B2* | 10/2015 | Shiraishi | H01L 23/49575 |
| 9,263,435 | B2* | 2/2016 | Kanazawa | H01L 23/4952 |
| 9,461,163 | B2* | 10/2016 | Shiraishi | H10D 30/0297 |
| 9,478,483 | B2* | 10/2016 | Sato | H01L 23/49524 |
| 9,502,388 | B2* | 11/2016 | Kanazawa | H01L 24/40 |
| 9,735,095 | B2* | 8/2017 | Padmanabhan | H01L 25/074 |
| 9,793,265 | B2* | 10/2017 | Shiraishi | H01L 24/37 |
| 10,083,884 | B2* | 9/2018 | Cho | H01L 25/18 |
| 10,204,899 | B2* | 2/2019 | Shiraishi | H02M 3/155 |
| 10,250,255 | B2* | 4/2019 | Yanagigawa | H03K 17/6871 |
| 10,256,228 | B2* | 4/2019 | Uzawa | H10D 89/611 |
| 10,340,379 | B2* | 7/2019 | Furuya | H10D 1/20 |
| 12,080,664 | B2* | 9/2024 | Yamamoto | H10D 30/668 |
| 12,165,999 | B2* | 12/2024 | Yamamoto | H10D 30/60 |
| 2009/0278167 | A1* | 11/2009 | Ozoe | H01L 24/97 257/676 |
| 2011/0127975 | A1* | 6/2011 | Hosokawa | H03K 17/063 323/271 |
| 2012/0086062 | A1* | 4/2012 | Hosokawa | H03K 17/063 257/300 |
| 2012/0146211 | A1* | 6/2012 | Shiraishi | H01L 21/28035 257/723 |
| 2012/0306020 | A1* | 12/2012 | Shiraishi | H10D 84/0149 257/E27.06 |
| 2014/0054692 | A1* | 2/2014 | Shiraishi | H01L 24/73 257/334 |
| 2014/0231829 | A1* | 8/2014 | Kanazawa | H01L 23/4952 257/77 |
| 2014/0332878 | A1* | 11/2014 | Shiraishi | H10D 30/0297 257/328 |
| 2016/0005854 | A1* | 1/2016 | Shiraishi | H10D 84/146 257/329 |
| 2016/0155726 | A1* | 6/2016 | Kanazawa | H10D 30/83 257/77 |
| 2016/0308529 | A1* | 10/2016 | Yanagigawa | H10D 62/60 |
| 2017/0005089 | A1* | 1/2017 | Shiraishi | H02M 7/003 |
| 2017/0025338 | A1* | 1/2017 | Padmanabhan | H01L 23/49524 |
| 2017/0186864 | A1* | 6/2017 | Furuya | H10D 30/655 |
| 2017/0373055 | A1* | 12/2017 | Shiraishi | H01L 24/73 |
| 2018/0211949 | A1* | 7/2018 | Uzawa | H10D 89/911 |
| 2023/0246002 | A1* | 8/2023 | Nakashiba | H01L 25/074 257/334 |
| 2023/0275069 | A1* | 8/2023 | Yanagigawa | H01L 23/49562 257/734 |
| 2023/0290879 | A1* | 9/2023 | Hirabayashi | H10D 30/668 |
| 2023/0291401 | A1* | 9/2023 | Mori | H10D 30/668 |
| 2023/0307393 | A1* | 9/2023 | Yamamoto | H01L 24/08 |
| 2023/0326922 | A1* | 10/2023 | Shimoyama | H10D 64/513 |
| 2024/0030167 | A1* | 1/2024 | Yamamoto | H10D 30/668 |

FOREIGN PATENT DOCUMENTS

| | | | | |
|---|---|---|---|---|
| CN | 206163479 U | * | 5/2017 | ....... H01L 23/49524 |
| CN | 108668408 A | * | 10/2018 | |
| CN | 113629016 A | * | 11/2021 | ............ H01L 23/12 |
| CN | 215815838 U | * | 2/2022 | ............ H01L 23/12 |
| CN | 116544227 A | * | 8/2023 | ........ H01L 23/4981 |
| CN | 116545213 A | * | 8/2023 | ........ H01L 23/4828 |
| EP | 2763160 A1 | * | 8/2014 | ............ H01L 21/64 |
| JP | 2009-295961 A | | 12/2009 | |
| JP | 2012-243930 A | | 12/2012 | |
| JP | 2014-161147 A | | 9/2014 | |
| JP | 2016-207716 A | | 12/2016 | |
| JP | 2023113217 A | * | 8/2023 | ........ H01L 23/4828 |
| JP | 2023113218 A | * | 8/2023 | ........ H01L 23/49811 |
| JP | 2023131415 A | * | 9/2023 | ............ H01L 25/074 |
| KR | 20140082679 A | * | 7/2014 | ............ H01L 24/37 |
| TW | 202333344 A | * | 8/2023 | ........ H01L 23/49811 |
| TW | 202333382 A | * | 8/2023 | ........ H01L 23/4828 |
| WO | WO-2013046439 A1 | * | 4/2013 | ............ H01L 21/64 |

* cited by examiner

A-A CROSS-SECTION

B-B CROSS-SECTION

A-A CROSS-SECTION

B-B CROSS-SECTION

<STUDIED EXAMPLE>

<STUDIED EXAMPLE>

FIG. 13

|  | FIRST EMBODIMENT | STUDIED EXAMPLE |
|---|---|---|
| 1Q ON-RESISTANCE | 0.4 | 1.0 |
| 2Q ON-RESISTANCE | 0.6 | 0.6 |
| RESISTANCE OF EXTERNAL CONNECTION TERMINAL | 2*0.6/3 | 2*0.6 |
| RESISTANCE OF LEAD FRAME | 0.2 | 0.6 |
| TOTAL | 1.6 | 3.4 |

SEMICONDUCTOR DEVICE AND CIRCUIT DEVICE

CROSS-REFERENCE TO RELATED APPLICATION

The disclosure of Japanese Patent Application No. 2022-015407 filed on Feb. 3, 2022, including the specification, drawings and abstract is incorporated herein by reference in its entirety.

BACKGROUND

The present invention relates to a semiconductor device and a circuit device, and, more particularly relates to a semiconductor device including an n-type MOSFET and a circuit device using the semiconductor device.

On motor vehicles, a lot of electrical apparatuses such as headlamps and power windows requiring power are mounted. A relay has been used as a switch for power supply from a battery to such an electrical apparatus or for interrupting the power supply. In recent years, a semiconductor device including an n-type power MOSFET (Metal Oxide Semiconductor Field Effect Transistor) has been used in place of the relay.

In maintenance of the battery or others, a cable connected to the battery is detached in some cases.

However, after the maintenance, the cable is reconnected to the battery. At this time, failure to reversely connect the cable to a positive electrode or a negative electrode of the battery may occur. In the switch using the relay, even in the case of the reverse connection, electric current does not flow when the switch is turned OFF.

However, in the switch using the semiconductor device, the electric current undesirably flows through a parasitic diode formed in the power MOSFET even when the power MOSFET is turned OFF. In order to prevent such electric-current reverse flow, p-type power MOSFETs are connected in series between a drain of the n-type power MOSFET and the positive electrode of the battery.

In this case, a (first example) method of preparing a semiconductor chip including the n-type power MOSFET and a semiconductor chip including the p-type power MOSFET that are packaged in different packages is conceivable as an aspect of a semiconductor device (semiconductor module). Alternatively, a (second example) method of preparing the semiconductor chip including the n-type power MOSFET and the semiconductor chip including the p-type power MOSFET that lay flat and are packaged in single package is conceivable. However, the first example has a problem that is a large mounting area, and the second example has a problem that is a large packaging area.

There are disclosed techniques listed below.
[Patent Document 1] Japanese Unexamined Patent Application Publication No. 2016-207716
[Patent Document 2] Japanese Unexamined Patent Application Publication No. 2012-243930

In Patent Document 1, in order to prevent the electric-current reverse flow, n-type power MOSFETs in which sources and drains are reversely connected in series are used in place of the p-type power MOSFET. The Patent Document discloses a (third example) semiconductor device including two n-type power MOSFETs that are formed on the same semiconductor substrate and are packaged in single package. The source of one n-type power MOSFET is connected to the positive electrode of the battery, the drain of one n-type power MOSFET is connected to the drain of the other n-type power MOSFET, and the source of the other n-type power MOSFET is connected to the negative electrode of the battery.

The Patent Document 2 discloses a semiconductor device including a trench-gate n-type power MOSFET and a planar n-type power MOSFET that are formed on the same semiconductor substrate.

SUMMARY

In the (third example) semiconductor device of the Patent Document 1, the mounting area and the packaging area can be made smaller than those of the first and second examples.

However, the drains of the two n-type power MOSFETs are connected to each other through an n-type drift region in the semiconductor substrate, a drain electrode formed on a back surface of the semiconductor substrate and a lead frame formed below the drain region. In other words, a resistance component in a horizontal direction between the two n-type power MOSFETs is large, and therefore, there is a problem that is difficulty in improvement of a performance of the semiconductor device. Therefore, when the semiconductor device is used as the switch, there is a problem that is difficulty in reduction of switch loss.

A main purpose of the present application is to reduce the mounting area and the packaging area to be smaller than those of the first and second examples, and to reduce the resistance component to be smaller than that of the third example to improve the performance of the semiconductor device. As a result, loss in a circuit device using the semiconductor device as the switch is reduced.

Other objects and novel characteristics will be apparent from the description of the present specification and the accompanying drawings.

The outline of the typical aspects of the embodiments disclosed in the present application will be briefly described as follows:

A semiconductor device according to one embodiment includes: a first semiconductor chip including a first MOSFET of n-type and a first parasitic diode formed in the first MOSFET; and a second semiconductor chip including a second MOSFET of n-type and a second parasitic diode formed in the second MOSFET. In this case, a first source electrode and a first gate wiring are formed on a front surface of the first semiconductor chip, a first drain electrode is formed on a back surface of the first semiconductor chip, a first anode of the first parasitic diode is coupled to the first source electrode, and a first cathode of the first parasitic diode is coupled to the first drain electrode, a second source electrode and a second gate wiring are formed on a front surface of the second semiconductor chip, a second drain electrode is formed on a back surface of the second semiconductor chip, a second anode of the second parasitic diode is coupled to the second source electrode, and a second cathode of the second parasitic diode is coupled to the second drain electrode, and the front surface of the first semiconductor chip and the front surface of the second semiconductor chip face each other such that the first source electrode and the second source electrode are in contact with each other via a first conductive member.

According to one embodiment, the performance of the semiconductor device can be improved. And, the loss in the circuit device using the semiconductor device as the switch can be reduced.

BRIEF DESCRIPTIONS OF THE DRAWINGS

FIG. 13 is a table of comparison between a resistance value of the first embodiment and a resistance value of the studied example.

DETAILED DESCRIPTION

Hereinafter, embodiments will be described in detail with reference to the accompanying drawings. Note that components having the same function are denoted by the same reference signs throughout all the drawings for describing the embodiments, and the repetitive description thereof will be omitted. In addition, the description of the same or similar portions is not repeated in principle unless particularly required in the following embodiments.

First Embodiment

Circuit Device Using Semiconductor Device

Figure 1:
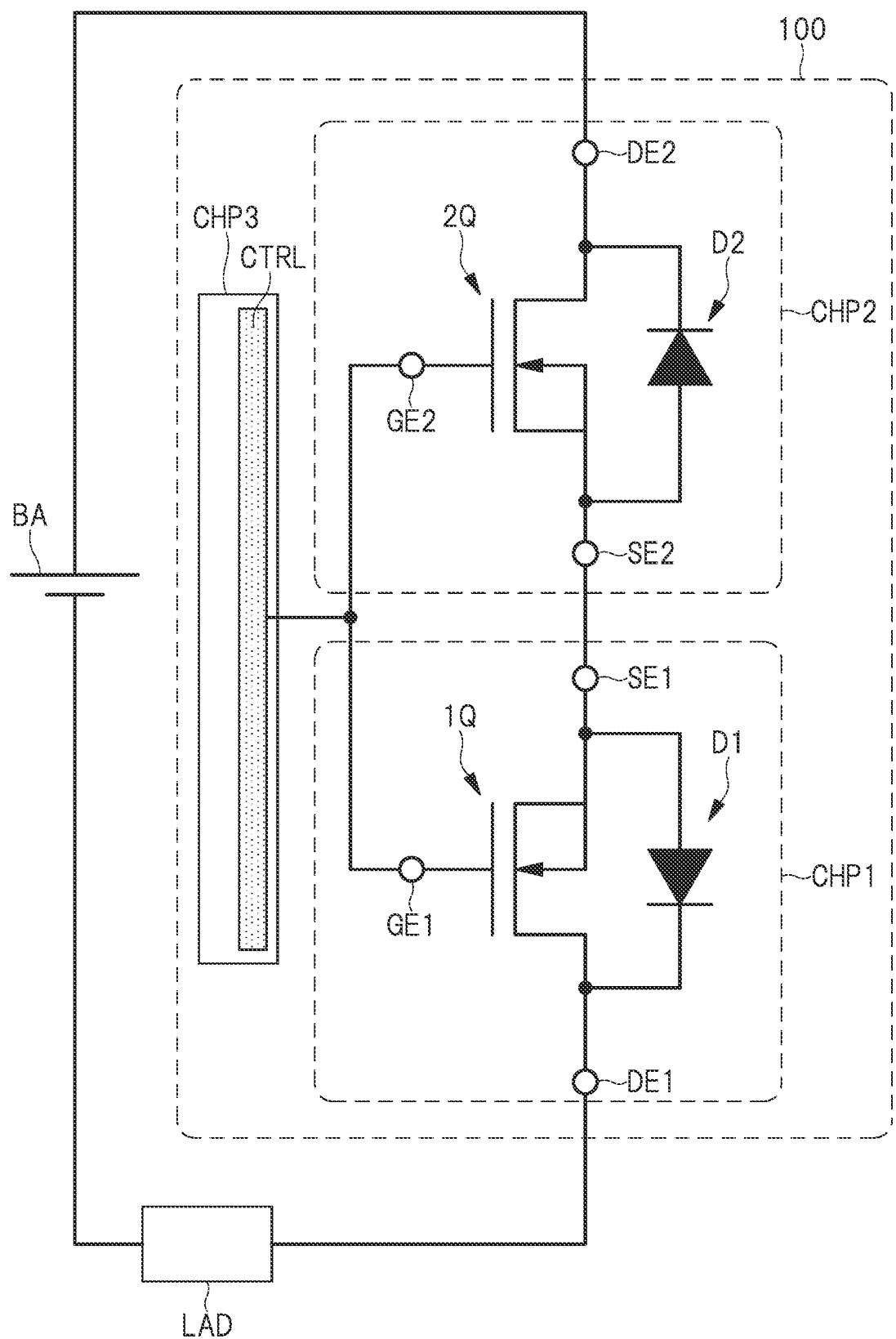
FIG. 1 is an equivalent circuit diagram showing a circuit device using a semiconductor device according to a first embodiment.

FIG. 1 shows a circuit device using a semiconductor device 100 according to the first embodiment as a switch. The semiconductor device 100 is a semiconductor module including: a semiconductor chip CHP1 including a MOSFET 1Q of n-type and a parasitic diode D1; and a semiconductor chip CHP2 including a MOSFET 2Q of n-type and a parasitic diode D2. The semiconductor device 100 may include a semiconductor chip CHP3 including a control circuit CTRL.

The circuit device of FIG. 1 includes: the semiconductor device 100 used as the switch; a battery BA; and a load LAD. The load LAD is an electrical apparatus such as a headlamp or a power window mounted on a motor vehicle.

A drain electrode DE2 of the MOSFET 2Q is electrically connected to a positive electrode of the battery BA. A source electrode SE2 of the MOSFET 2Q is electrically connected to a source electrode SE1 of the MOSFET 1Q. A drain electrode DE1 of the MOSFET 1Q is electrically connected to a negative electrode of the battery BA through the load LAD. A gate electrode GE1 of the MOSFET 1Q and a gate electrode GE2 of the MOSFET 2Q are connected to each other, and are electrically connected to the control circuit CTRL.

Note that the control circuit CTRL has a function of supplying a gate potential to the gate electrodes GE1 and GE2 in order to switch the ON/OFF state of each of the MOSFETs 1Q and 2Q. As a circuit having another function, the control circuit CTRL may include a voltage booster circuit, an overheat shut-down control circuit, an overcurrent limiter circuit, a monitor circuit for current detection, voltage detection or others.

In the first embodiment, the gate electrode GE1 and the gate electrode GE2 are electrically connected to the control circuit CTRL while being connected to each other. Therefore, the control circuit CTRL can simultaneously switch the ON/OFF state of the MOSFET 1Q and the ON/OFF state of the MOSFET 2Q.

The parasitic diode D1 is formed in the MOSFET 1Q. The anode of this parasitic diode D1 is coupled to the source electrode SE1 as shown in FIG. 1. The cathode of this parasitic diode D1 is coupled to the drain electrode DE1 as shown in FIG. 1.

The parasitic diode D2 is formed in the MOSFET 2Q. The anode of this parasitic diode D2 is coupled to the source electrode SE2 as shown in FIG. 1. The cathode of this parasitic diode D2 is coupled to the drain electrode DE2 as shown in FIG. 1.

The MOSFET 2Q is a device for the switching operation (the ON operation and the OFF operation) to supply the power to the load LAD if needed in the case of appropriate connection of the battery BA to the semiconductor device 100. The MOSFET 1Q is a device for preventing the electric-current reverse flow in the case of the reverse connection of the battery BA to the semiconductor device 100.

The circuit operation in the case of the appropriate connection of the battery BA to the semiconductor device 100 will be explained. First, the case of the power supply from the battery BA to the load LAD will be explained. A gate potential that is equal to or higher than a threshold voltage of the MOSFETs 1Q and 2Q is supplied from the control circuit CTRL to the gate electrodes GE1 and GE2 to turn ON the MOSFETs 1Q and 2Q. As a result, the electric current flows from the battery BA to the load LAD.

The case of the interruption of the power supply to the load LAD will be explained. For example, a ground potential (GND) is supplied from control circuit CTRL to the gate electrodes GE1 and GE2 to turn OFF the MOSFETs 1Q and 2Q. In this case, the electric current does not flow in the parasitic diode D2. As a result, the electric current does not flow from the battery BA to the load LAD.

Next, the circuit operation in the case of the reverse connection of the battery BA to the semiconductor device 100 will be explained. The MOSFETs 1Q and 2Q are turned OFF. In this case, the electric current does not flow in the parasitic diode D1. As a result, the electric current can be prevented from flowing from the battery BA to the load LAD.

Structure of Mosfet and Parasitic Diode

Figure 2:
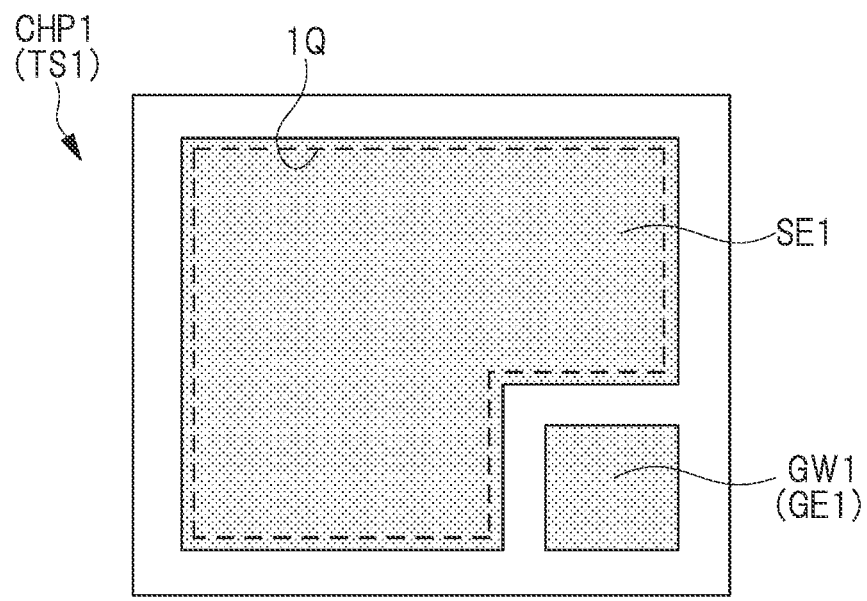
FIG. 2 is a plan view showing one semiconductor chip according to the first embodiment.
Figure 3:
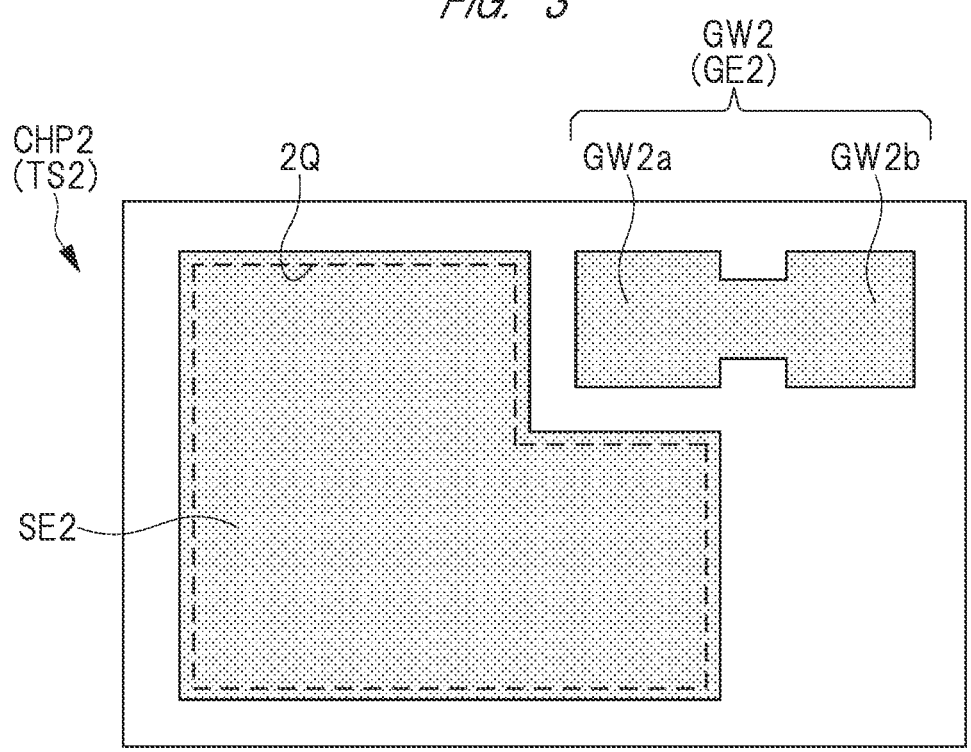
FIG. 3 is a plan view showing the other semiconductor chip according to the first embodiment.

The semiconductor chip CHP1 has a front surface TS1 and a back surface BS1, and the semiconductor chip CHP2 has a front surface TS2 and a back surface BS2. FIG. 2 is a plan view of the semiconductor chip CHP1 viewed from a region close to the front surface TS1. FIG. 3 is a plan view of the semiconductor chip CHP2 viewed from a region close to the front surface TS2. Note that a planar area of the semiconductor chip CHP2 is larger than a planar area of the semiconductor chip CHP1.

As shown in FIG. 2, the source electrode SE1 and the gate wiring GW1 are formed on the front surface TS1 of the semiconductor chip CHP1. The semiconductor chip CHP1 is mostly covered with the source electrode SE1, and the MOSFET 1Q is mainly formed below the source electrode SE1. The gate electrode GE1 of the MOSFET 1Q is electrically connected to the gate wiring GW1.

As shown in FIG. 3, the source electrode SE2 and the gate wiring GW2 are formed on the front surface TS2 of the semiconductor chip CHP2. The semiconductor chip CHP2 is mostly covered with the source electrode SE2, and the MOSFET 2Q is mainly formed below the source electrode SE2. The gate electrode GE2 of the MOSFET 2Q is electrically connected to the gate wiring GW2.

The gate wiring GW2 includes a connecting portion GW2a and a connecting portion GW2b unified with the connecting portion GW2a. The connecting portion GW2a is arranged to be connected to the gate wiring GW1 of the semiconductor chip CHP1, and the connecting portion GW2b is arranged to be connected to an external connecting member 21 and others.

Figure 4:
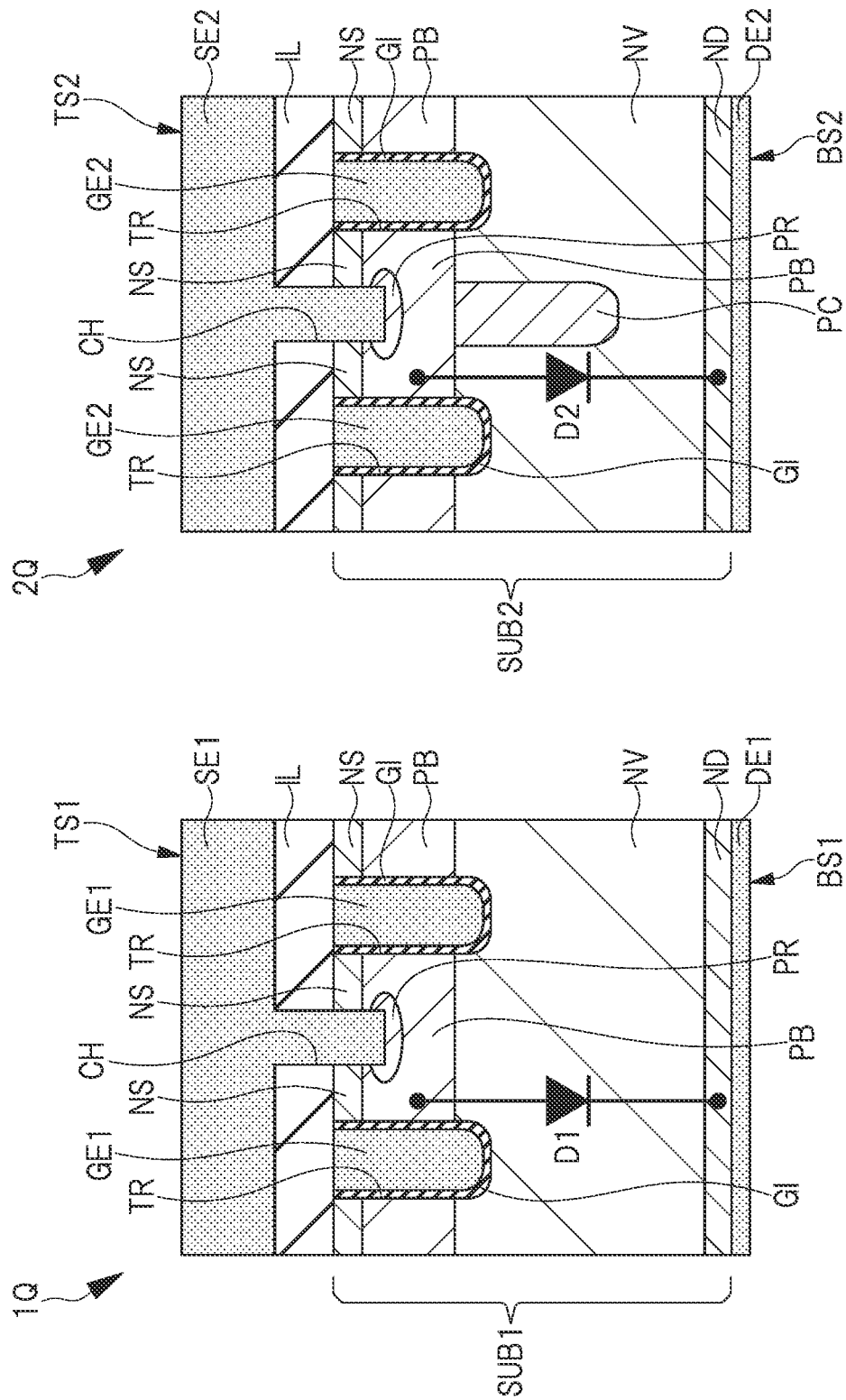
FIG. 4 is a cross-sectional view showing two MOSFETs and two parasitic diodes formed in two semiconductor chips according to the first embodiment.

Structures of the MOSFET 1Q, the parasitic diode D1, the MOSFET 2Q and the parasitic diode D2 will be explained below with reference to FIG. 4. Note that a plurality of MOSFETs that are connected in parallel is practically formed in the semiconductor chips CHP1 and CHP2. Therefore, in terms of an equivalent circuit, the plurality of MOSFETs can be regarded as one MOSFET. In the MOSFETs 1Q and 2Q explained in the present application, the plurality of MOSFETs that are connected in parallel is collectively regarded as one MOSFET.

First, the structures of the MOSFET 1Q and the parasitic diode D1 will be explained.

A semiconductor substrate SUB1 has a front surface and a back surface, and includes an n-type drift region NV of a low concentration. In this case, the semiconductor substrate SUB1 is an n-type silicon substrate, and the semiconductor substrate SUB1 itself configures the drift region NV. Note that the drift region NV may be a stacking body made of the n-type silicon substrate and a semiconductor layer that is grown on the silicon substrate while being doped with phosphorus (P) by an epitaxial growing method. In the present application, such a stacking body will be also explained to be the semiconductor substrate SUB1.

In a region close to the front surface of the semiconductor substrate SUB1, a p-type body region PB is formed in the semiconductor substrate SUB1. In the body region PB, an n-type source region NS is formed. The source region NS has a higher impurity concentration than that of the drift region NV.

In the region close to the front surface of the semiconductor substrate SUB1, a trench TR is formed in the semiconductor substrate SUB1. A bottom of the trench TR reaches a position that is deeper than the body region PB. A gate insulating film GI is formed inside the trench TR. The gate electrode GE1 is formed on the gate insulating film GI to be buried inside the trench TR. In other words, the MOSFET 1Q has a trench-gate structure. The gate insulating film GI is, for example, a silicon oxide film, and the gate electrode GE1 is, for example, an n-type polycrystal silicon film.

An interlayer insulating film IL is formed on the front surface of the semiconductor substrate SUB1 so as to cover the gate electrode GE1. The interlayer insulating film IL is, for example, a silicon oxide film. A hole CH is formed in the interlayer insulating film IL. The hole CH penetrates the interlayer insulating film IL and the source region NS so that its bottom is positioned inside the body region PB. At the bottom of the hole CH inside the body region PB, a p-type high-content region PR is formed. The high-content region PR has a higher impurity concentration that that of the body region PB.

On the interlayer insulating film IL, the source electrode SE1 is formed to be buried inside the hole CH. The source electrode SE1 is electrically connected to the source region NS, the body region PB and the high-content region PR to supply the source potential thereto. Note that the gate wiring GW1 is also formed on the interlayer insulating film IL although not illustrated in the drawing. A plurality of the gate electrodes GE1 is collectively connected to a gate drawing-out portion at an outer circumference of the semiconductor chip CHP1. The hole CH is also formed on the gate drawing-out portion, and the gate wiring GW1 is buried inside the hole CH.

Therefore, the gate wiring GW1 is electrically connected to the gate electrode GE1 to supply the gate potential to the gate electrode GE1.

Each of the source electrode SE1 and the gate wiring GW1 is made of, for example, a barrier metal film and a conductive film formed on the barrier metal film. The barrier metal film is, for example, a titanium nitride film, and the conductive film is, for example, an aluminium film.

Note that each of the source electrode SE1 and the gate wiring GW1 may be made of a plug layer being buried inside the hole CH and a wiring portion formed on the interlayer insulating film IL. In this case, the wiring portion is a stacking film made of the titanium nitride film and the aluminium film, and the plug layer is a stacking film made of a barrier metal film such as a titanium nitride film and a conductive film such as a tungsten film.

In a region close to the back surface of the semiconductor substrate SUB1, an n-type drain region ND is formed in the semiconductor substrate SUB1. The drain region ND has a higher impurity concentration than that of the drift region NV. The drain electrode DE1 is formed below the back surface of the semiconductor substrate SUB1. The drain electrode DE1 is electrically connected to the drain region ND and the drift region NV to supply the drain potential to the drain region ND. The drain electrode DE1 is made of, for example, a single-layer metal film of an aluminium film, a titanium film, a nickel film, a gold film or a silver film, or a stacking film formed by appropriately stacking these metal films.

The parasitic diode D1 is made of the body region PB, and the semiconductor substrate SUB1 (drift region NV) and the drain region ND below the body region PB. In other words, the parasitic diode D1 is a P/N diode using the body region PB as the anode and using the semiconductor substrate SUB1 and the drain region ND as the cathode in the semiconductor chip CHP1.

The structure of the MOSFET 2Q is basically the same as the structure of the MOSFET 1Q except that signs of the semiconductor substrate SUB2, the front surface TS2, the back surface BS2, the gate electrode GE2, the source electrode SE2, the gate wiring GW2 and the drain electrode DE2 are different. Therefore, explanation for the details of the structure of the MOSFET 2Q is overlapped, and thus, omitted.

The parasitic diode D2 is made of the body region PB, and the semiconductor substrate SUB2 (drift region NV) and the drain region ND below the body region PB. In other words, the parasitic diode D2 is a P/N diode using the body region PB as the anode and using the semiconductor substrate SUB2 and the drain region ND as the cathode in the semiconductor chip CHP2.

A difference from the MOSFET 1Q is that the MOSFET 2Q includes a p-type column region PC formed in the semiconductor substrate SUB2 below the body region PB.

The column region PC has a higher impurity concentration than that of the body region PB. In the case of the n-type MOSFET 2Q, since such a p-type column region PC is formed, depletion is generated around the column region PC to improve the breakdown voltage.

Since the column region PC is in contact with the body region PB in this case, the source potential is also supplied to the p-type column region PC. However, the column region PC may physically separate from the body region PB, or may be in a floating structure.

The column region PC may be also formed in the MOSFET 1Q. However, by the formation of the column region PC, the ON resistance is increased. The MOSFET 2Q is a main device serving as the switch in the circuit device of FIG. 1. Therefore, in order to secure the reliability of the switch in the case of the connection of the battery BA, the column region PC is preferably formed in the MOSFET 2Q. In order to quickly supply the power to the load LAD, the column region PC is preferably not formed to reduce the ON resistance.

Meanwhile, when the column region PC is formed in both the MOSFET 1Q and the MOSFET 2Q, or when the column region PC is formed in neither the MOSFET 1Q nor the MOSFET 2Q, the semiconductor chip CHP1 is the same as the semiconductor chip CHP2. Therefore, in such cases, there is no need for the development, the manufacture or the preparation of another semiconductor chip, and therefore, time and effort for the manufacture of the semiconductor device 100 can be simplified.

Structure of Semiconductor Device

Figure 5:
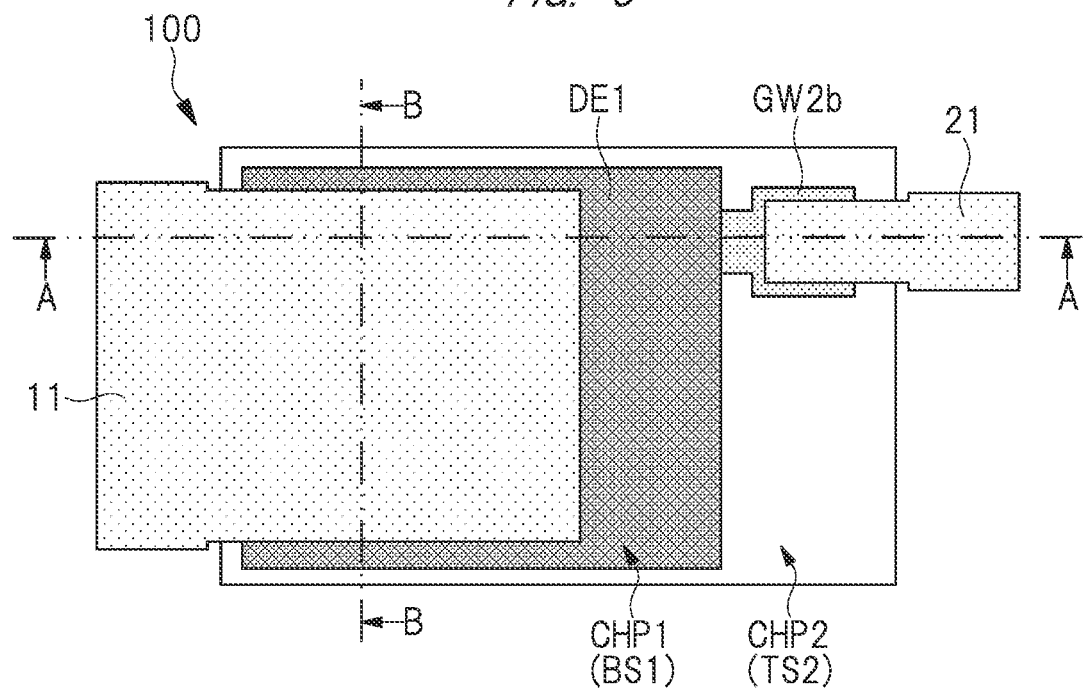
FIG. 5 is a plan view showing a semiconductor device according to the first embodiment.
Figure 7:
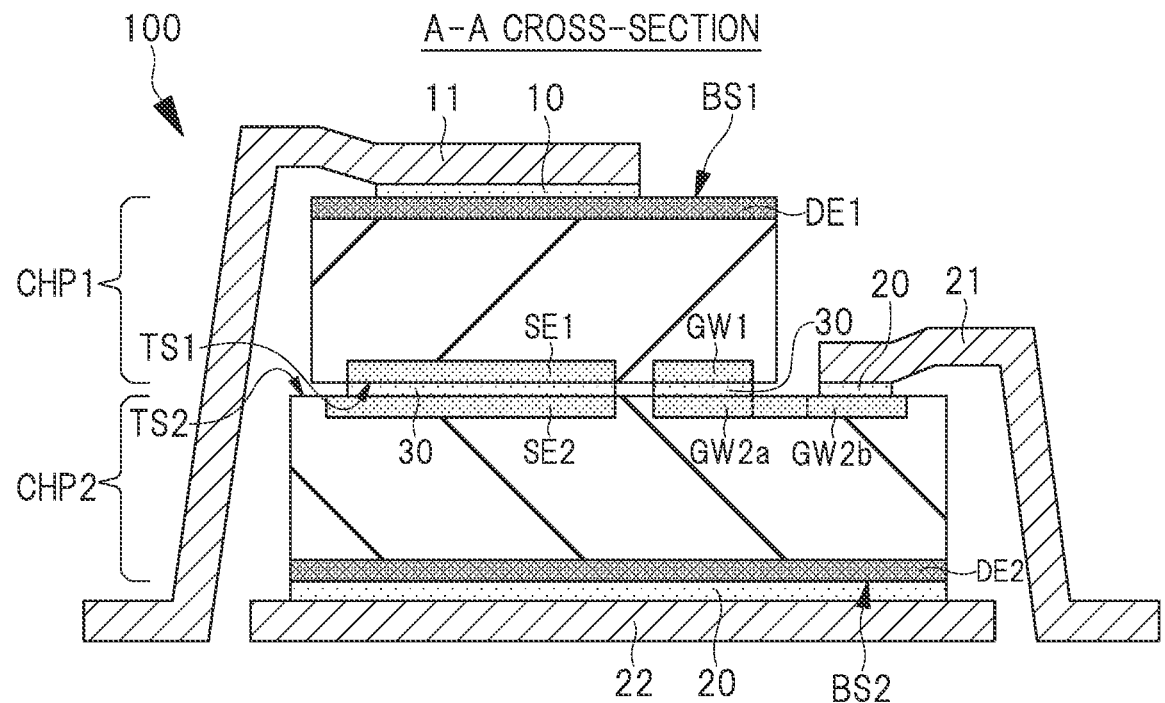
FIG. 7 is a cross-sectional view showing a semiconductor device according to the first embodiment.
Figure 8:
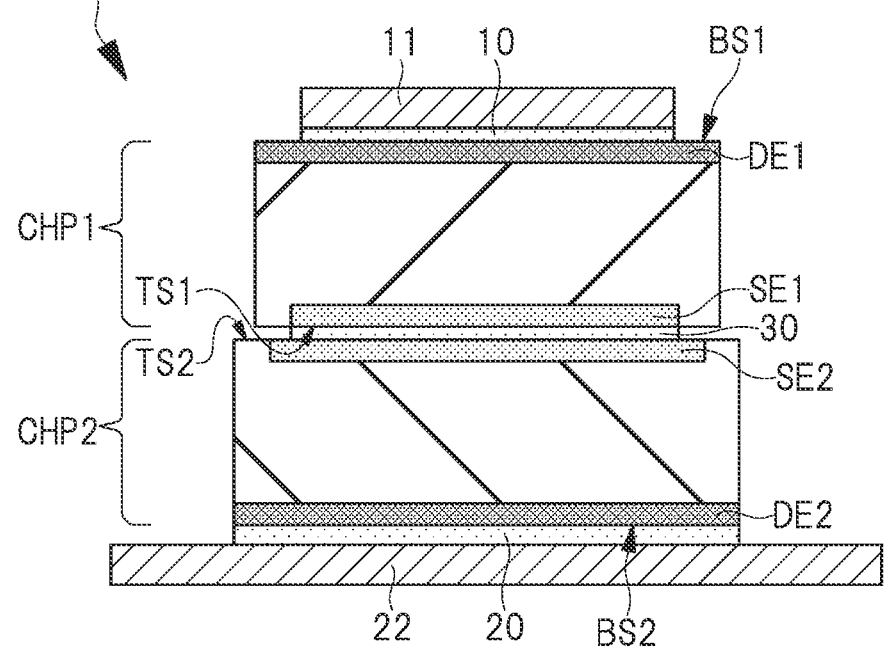
FIG. 8 is a cross-sectional view showing a semiconductor device according to the first embodiment.

The structure of the semiconductor device 100 will be explained below with reference to FIGS. 5 to 10. FIG. 5 is a plan view showing the semiconductor device 100. FIG. 7 is a cross-sectional view taken along a line A-A of FIG. 5. FIG. 8 is a cross-sectional view taken along a line B-B of FIG. 5.

Figure 6:
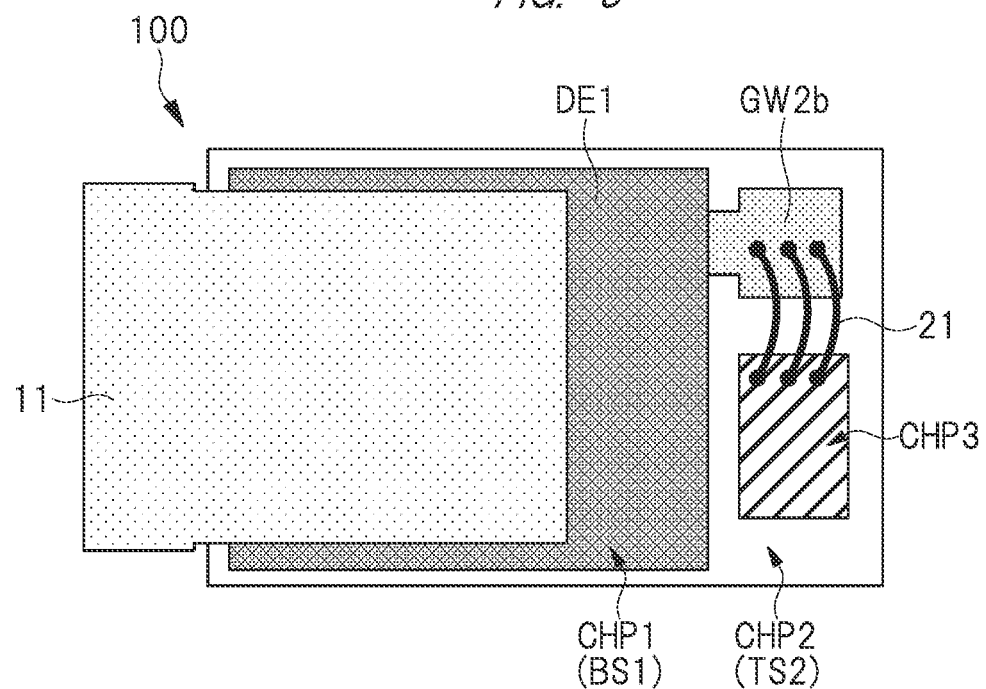
FIG. 6 is a plan view showing a semiconductor device according to the first embodiment.

Note that FIG. 6 shows a state of a case in which a semiconductor chip CHP3 including the control circuit CTRL is mounted on the semiconductor chip CHP2. The semiconductor chip CHP3 is arranged above the front surface TS2 of the semiconductor device CHP2 via an insulating resin or others. In this case, although not illustrated, a pad electrode is arranged on the front surface of the semiconductor chip CHP3 to be a part of the control circuit CTRL, and this pad electrode and the connecting portion GW2b are electrically connected by the external connecting member 21 such as a bonding wire.

As shown in FIGS. 7 and 8, in the semiconductor device 100, the semiconductor chip CHP1 and the semiconductor chip CHP2 are stacked so that the semiconductor chip CHP1 is turned up and down. In other words, the front surface TS1 of the semiconductor chip CHP1 and the front surface TS2 of the semiconductor chip CHP2 face each other such that the source electrode SE1 and the source electrode SE2 are in contact with each other via a conductive member. The gate wiring GW1 is in contact with the connecting portion GW2a of the gate wiring GW2 via a conductive member. In the first embodiment, note that these conductive members are, for example, conductive paste 30 such as silver paste.

As shown in FIGS. 5 to 8, in a region close to the back surface BS1 of the semiconductor chip CHP1, the drain electrode DE1 is connected to an external connecting member 11 through the conductive paste 10. In a region close to the back surface BS2 of the semiconductor chip CHP2, the drain electrode DE2 is connected to a lead frame 22 through the conductive paste 20.

The connecting portion GW2b is arranged at a position not overlapping the semiconductor chip CHP1 in plan view. Therefore, in a region close to the front surface TS2 of the semiconductor chip CHP2, the external connecting member 21 can be connected to the connecting portion GW2b through the conductive paste 20. Note that the stacking of the semiconductor chip CHP1 having the small planar area on the semiconductor chip CHP2 having the large planar area is more advantageous in terms of simplification of the mounting since the external connecting member 21 can be arranged in the region close to the front surface TS2.

Each of the conductive paste 10 and 20 is, for example, silver paste. Each of the external connecting members 11 and 21 is, for example, a clip (copper plate) or a bonding wire made of copper or aluminium. The case of the usage of the clip for the external connecting members 11 and 21 is exemplified here, and the clip is processed to bend toward the back surface BS2 of the semiconductor chip CHP2.

Figure 9:
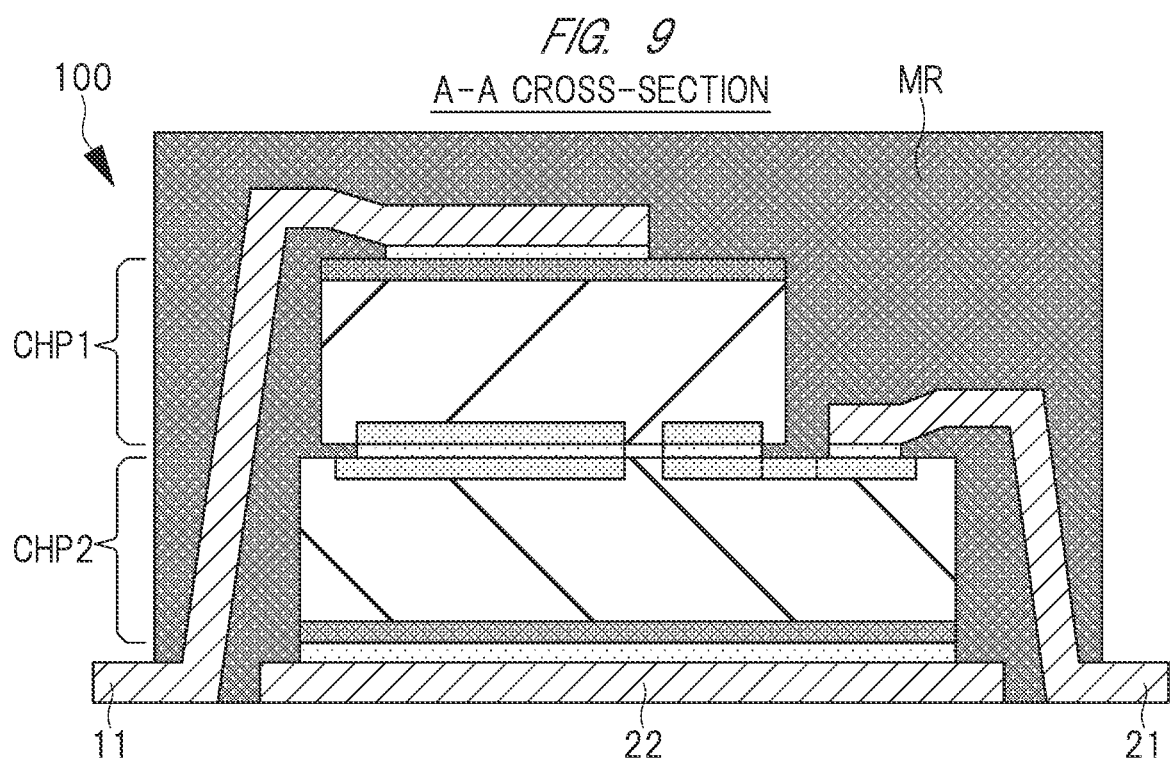
FIG. 9 is a cross-sectional view showing a semiconductor device according to the first embodiment.
Figure 10:
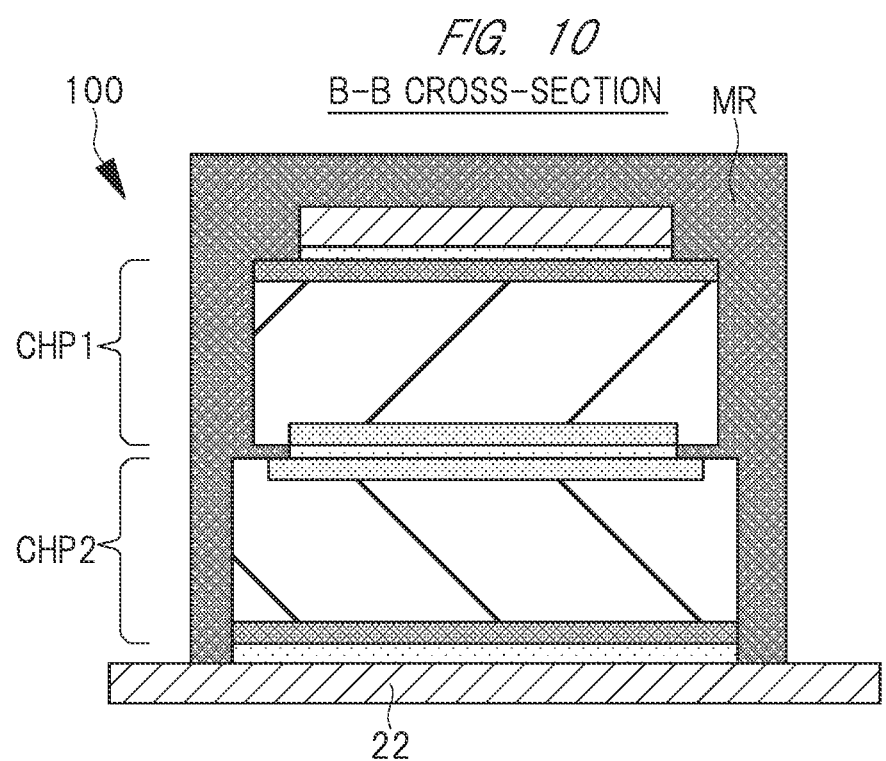
FIG. 10 is a cross-sectional view showing a semiconductor device according to the first embodiment.

As shown in FIGS. 9 and 10, the semiconductor chip CHP1, the semiconductor chip CHP2, the conductive paste 10, 20 and 30, the external connecting members 11 and 21, and the lead frame 22 are sealed by a sealing resin MR. A part of the external connecting members 11 and 21 and the lead frame 22 is exposed out of the sealing resin MR. As a result, the MOSFETs 1Q and 2Q can be electrically connected to another semiconductor chip, another wiring board, another electronic apparatus or others through the exposed part of the external connecting members 11 and 21 and the lead frame 22. In other words, the switch made of the MOSFETs 1Q and 2Q can be electrically connected to the battery BA, the load LAD and others as shown in FIG. 1.

When the semiconductor chip CHP3 is mounted as shown in FIG. 6, note that the semiconductor chips CH1 to CHP3 can be provided in single package by the sealing of the semiconductor chip CHP3 together with the semiconductor chips CH1 and CH2 with the sealing resin MR. Alternatively, the semiconductor chip CHP3 and the semiconductor chips CH1 and CH2 may be separately packaged.

Comparison with Studied Example

Figure 11:
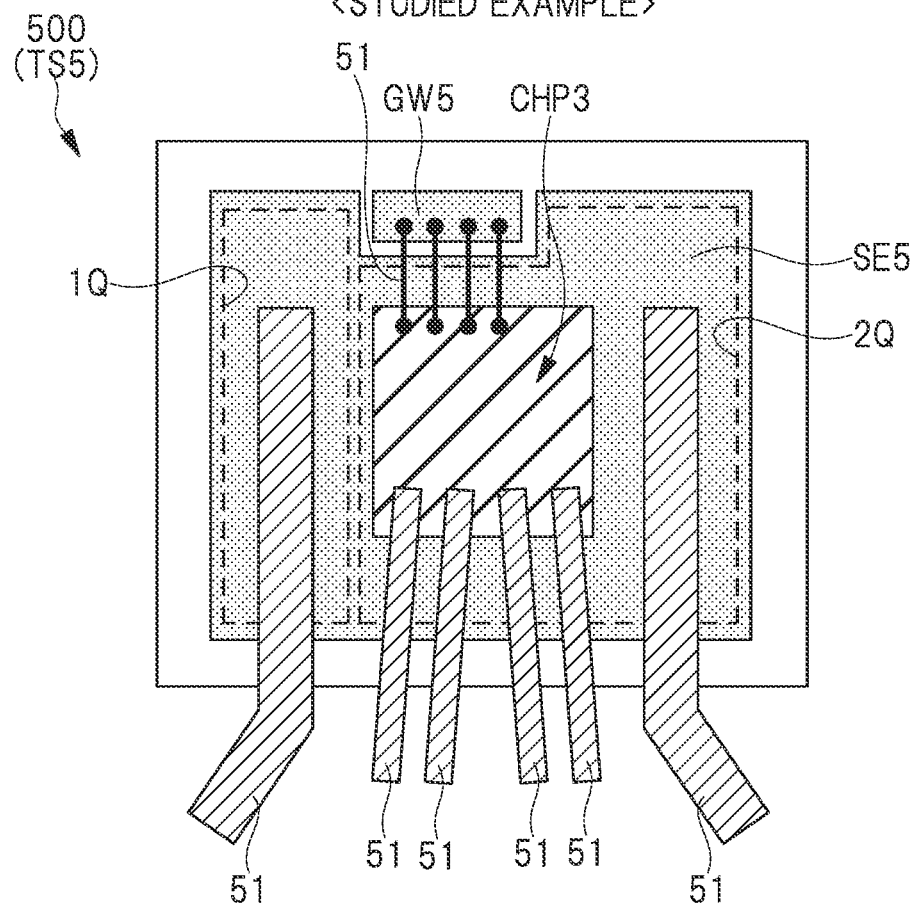
FIG. 11 is a plan view showing a semiconductor device according to a studied example.
Figure 12:
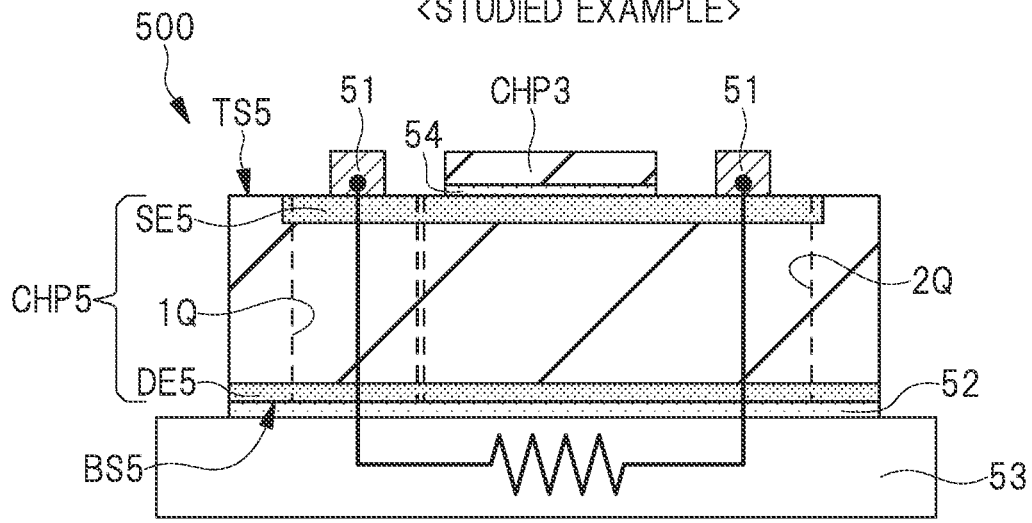
FIG. 12 is a cross-sectional view showing the semiconductor device according to the studied example.

Each of FIGS. 11 and 12 shows a semiconductor device 500 in a studied example studied on the packaging case of two n-type MOSFETs disclosed in the Patent Document 1 (third example) by the inventors of the present application.

As shown in FIGS. 11 and 12, a semiconductor chip CHP5 of the studied example includes the n-type MOSFET 1Q and the n-type MOSFET 2Q formed on the same semiconductor substrate. A source electrode SE5 and a gate wiring GW5 are formed on a front surface TS5 of the semiconductor chip CHP5, and a drain electrode DE5 is formed on a back surface BS5 of the semiconductor chip CHP5.

Even in the studied example, as similar to the first embodiment, the n-type MOSFET 2Q corresponds to the main device serving as the switch in the circuit device, and the n-type MOSFET 1Q corresponds to the device for preventing the electric-current reverse flow. As seen from FIG. 1 of the Patent Document 1, the circuit device of the studied example is different from FIG. 1 of the first embodiment in that the drain of the n-type MOSFET 2Q and the drain of the n-type MOSFET 1Q are connected in common, but is substantially equivalent to FIG. 1 of the first embodiment.

The source electrode SE5 and the gate wiring GW5 are directly connected to an external connecting member 51. The drain electrode DE5 is connected to a lead frame 53 through conductive paste 52. The semiconductor chip CHP3 including the control circuit CTRL is arranged above the source electrode SE5 via an insulating resin 54 or others.

In the studied example, drains of the two MOSFETs 1Q and 2Q are electrically connected through the drain electrode DE5 and an n-type drift region inside the semiconductor substrate and a lead frame 53. Therefore, since a resistance component in a horizontal direction between the two MOSFETs 1Q and 2Q is large, there is a problem that is difficulty in reduction of switch loss. Therefore, there is a problem that is difficulty in improvement of the performance of the semiconductor device.

And, since the MOSFETs 1Q and 2Q are formed on the same semiconductor substrate, the formation area of each of them is small. Particularly when priority is put on the MOSFET 2Q that is the main device, the formation area of the MOSFET 1Q is easily made small. Therefore, there is a problem that is difficulty in reduction of the ON resistance of the MOSFETs 1Q and 2Q. And, since an arrangement area for the external connecting member 51 cannot be increased, there is a problem that is easiness in increase of a resistance value related to them.

FIG. 13 is a table regarding each resistance value in comparison between the semiconductor device 100 of the first embodiment and the semiconductor device 500 of the studied example. Note that numerical values in FIG. 13 are illustrated as relative values. In this case, the numerical values are calculated in an assumption that the formation area of the MOSFET 2Q of the first embodiment is almost the same as the formation area of the MOSFET 2Q of the studied example.

In the first embodiment, the semiconductor chip CHP1 including the MOSFET 1Q separates from the semiconductor chip CHP2, and therefore, the formation area of the MOSFET 1Q can be made larger than that in the studied example. Therefore, the ON resistance of the MOSFET 1Q can be reduced.

In the first embodiment, the external connecting members 11 and 21 can be arranged on the front surface TS1 of the semiconductor chip CHP1 and the front surface TS2 of the semiconductor chip CHP2, respectively, and the lead frame 22 can be arranged on the back surface BS2 of the semiconductor chip CHP2. Therefore, the arrangement areas for the external connecting members and the lead frame are made large, and resistance values related to them are easily reduced. Roughly speaking, in the first embodiment, the external connecting members and the lead frames as many as about four to five times of them in the studied example can be arranged.

In the studied example, as seen in the lead frame 53 or others, the resistance component in the horizontal direction is large. In the first embodiment, the source electrode SE1 and the source electrode SE2 are in contact with each other in a vertical direction via the conductive paste 30. Therefore, a distance between the source electrode SE1 and the source electrode SE2 is small, and thus, the resistance component between the two MOSFETs 1Q and 2Q can be made small.

As described above, the first embodiment can achieve the mounting area and the packaging area that are equal to or smaller than those of the studied example (third example), and can reduce the resistance component to be smaller than that of the studied example, and therefore, can improve the performance of the semiconductor device 100. And, the loss in the circuit device using the semiconductor device 100 as the switch can be reduced.

In the first embodiment, the gate wiring GW1 is in contact with the connecting portion GW2a of the gate wiring GW2, and the connecting portion GW2b is electrically connected to the semiconductor chip CHP3 including the control circuit CTRL through the external connecting member 21. In other words, the gate wiring GW1 and the gate wiring GW2 are electrically connected to the control circuit CTRL while being connected to each other. Therefore, the ON/OFF state of the MOSFET 1Q and the ON/OFF state of the MOSFET 2Q can be simultaneously switched. Therefore, the circuit area related to these switching operations can be made half, and thus, the downsizing of the control circuit CTRL can be advanced.

Second Embodiment

A semiconductor device 100 according to a second embodiment will be explained below with reference to FIGS. 14 and 15. In the following explanation, note that differences from the first embodiment will be mainly explained, and explanation for overlapping points with the first embodiment will be omitted.

In the first embodiment, the gate wiring GW1 and the gate wiring GW2 are connected to each other. In the second embodiment, the gate wiring GW1 and the gate wiring GW2 separate from each other, and are electrically connected to the control circuit CTRL through the external connecting member 21. Therefore, the control circuit CTRL can individually switch the ON/OFF state of the MOSFET 1Q and the ON/OFF state of the MOSFET 2Q.

Figure 14:
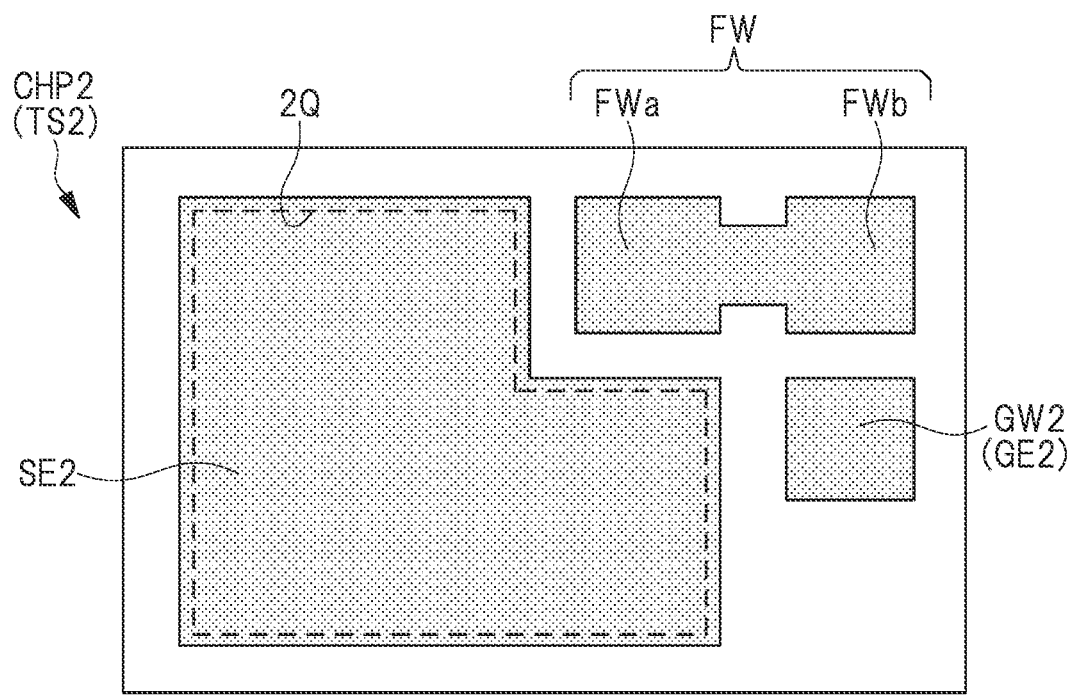
FIG. 14 is a plan view showing the other semiconductor chip according to a second embodiment.
Figure 15:
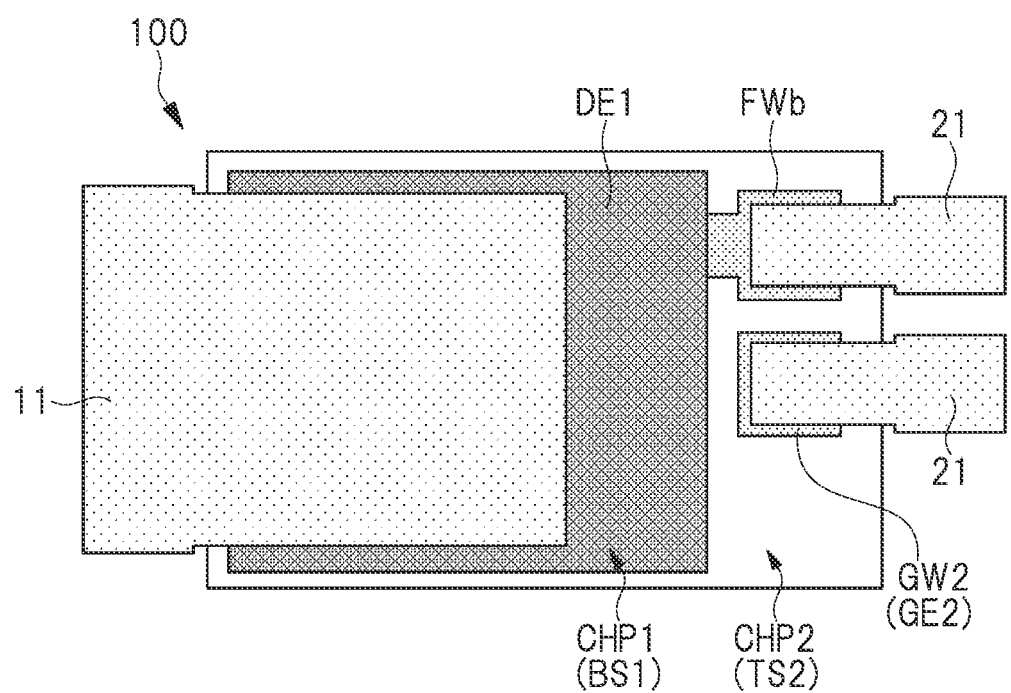
FIG. 15 is a plan view showing a semiconductor device according to the second embodiment.

As shown in FIGS. 14 and 15, a wiring FW is formed on the front surface TS2 of the semiconductor chip CHP2. The wiring FW is electrically insulated from the source electrode SE2, the gate wiring GW2 and the drain electrode DE2, and is a floating wiring. Note that the wiring FW is formed by the same manufacturing steps as those of the source electrode SE2 and the gate wiring GW2, and is made of the same material as those of the source electrode SE2 and the gate wiring GW2.

The wiring FW includes a connecting portion FWa and a connecting portion FWb unified with the connecting portion FWa. The connecting portion FWa is arranged for connection to the gate wiring GW1 of the semiconductor chip CHP1, and the connecting portion FWb is arranged for connection to the external connecting member 21 or others.

The gate wiring GW1 is in contact with the connecting portion FWa through the conductive member such as the conductive paste 30. The connecting portion FWb is arranged at a position not overlapping the semiconductor chip CHP1 in plan view. Therefore, in the region close to the front surface TS2 of the semiconductor chip CHP2, the external connecting member 21 can be connected to the connecting portion FWb through the conductive paste 20. In other words, the connecting portion FWb can be electrically connected to the semiconductor chip CHP3 including the control circuit CTRL or others through the external connecting member 21.

The gate wiring GW2 is arranged at a position not overlapping the semiconductor chip CHP1 in plan view. Therefore, in the region close to the front surface TS2 of the semiconductor chip CHP2, the external connecting member 21 can be connected to the gate wiring GW2 through the conductive paste 20. In other words, the gate wiring GW2 can be electrically connected to the semiconductor chip CHP3 including the control circuit CTRL or others through the external connecting member 21.

As described above, the semiconductor device 100 of the second embodiment can be favorably used when it is desirable to individually control the ON/OFF state of the MOSFET 1Q and the ON/OFF state of the MOSFET 2Q.

The second embodiment also can achieve the mounting area and the packaging area and can reduce the resistance component as much as those of the first embodiment, and therefore, can improve the performance of the semiconductor device 100. And, the loss in the circuit device using the semiconductor device 100 as the switch can be reduced.

Third Embodiment

Figure 16:
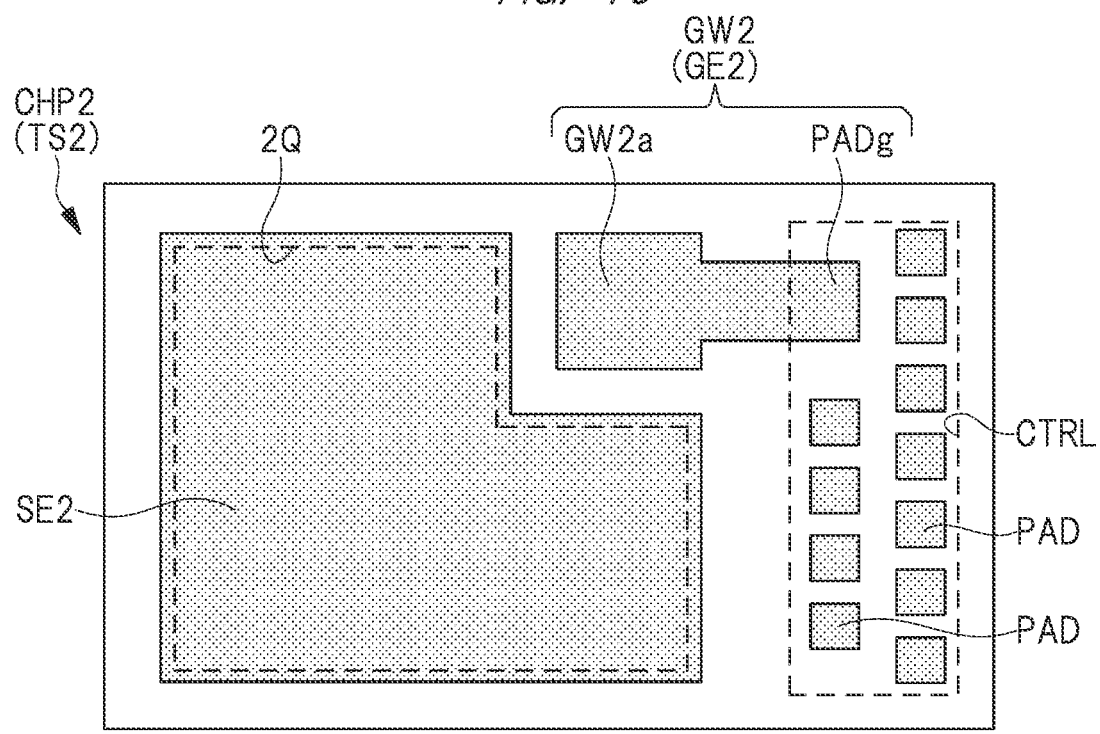
FIG. 16 is a plan view showing the other semiconductor chip according to a third embodiment.
Figure 17:
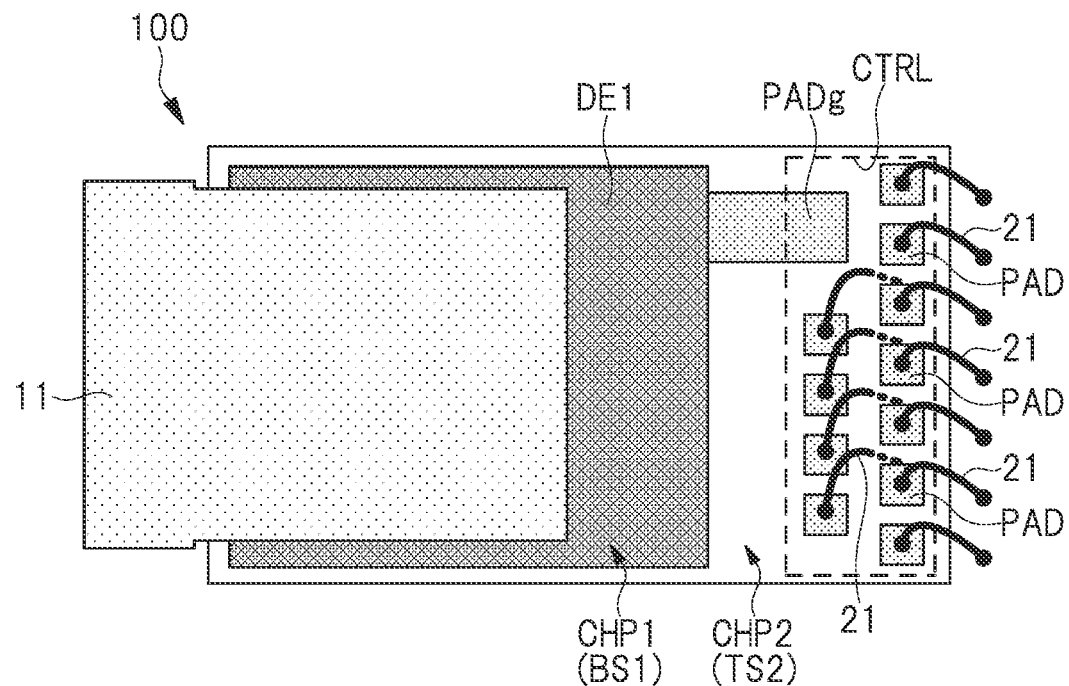
FIG. 17 is a plan view showing a semiconductor device according to the third embodiment.

A semiconductor device 100 according to a third embodiment will be explained below with reference to FIGS. 16 to 18. In the following explanation, note that differences from the first embodiment will be mainly explained, and explanation for overlapping points with the first embodiment will be omitted.

In the first embodiment, the control circuit CTRL is included in the semiconductor chip CHP3. In the third embodiment, the control circuit CTRL is included in the semiconductor chip CHP2 as shown in FIGS. 16 and 17. The transistor configuring the control circuit CTRL is formed in a region of the semiconductor substrate SUB2, the region being different from the region where the MOSFET 2Q is formed.

Figure 18:
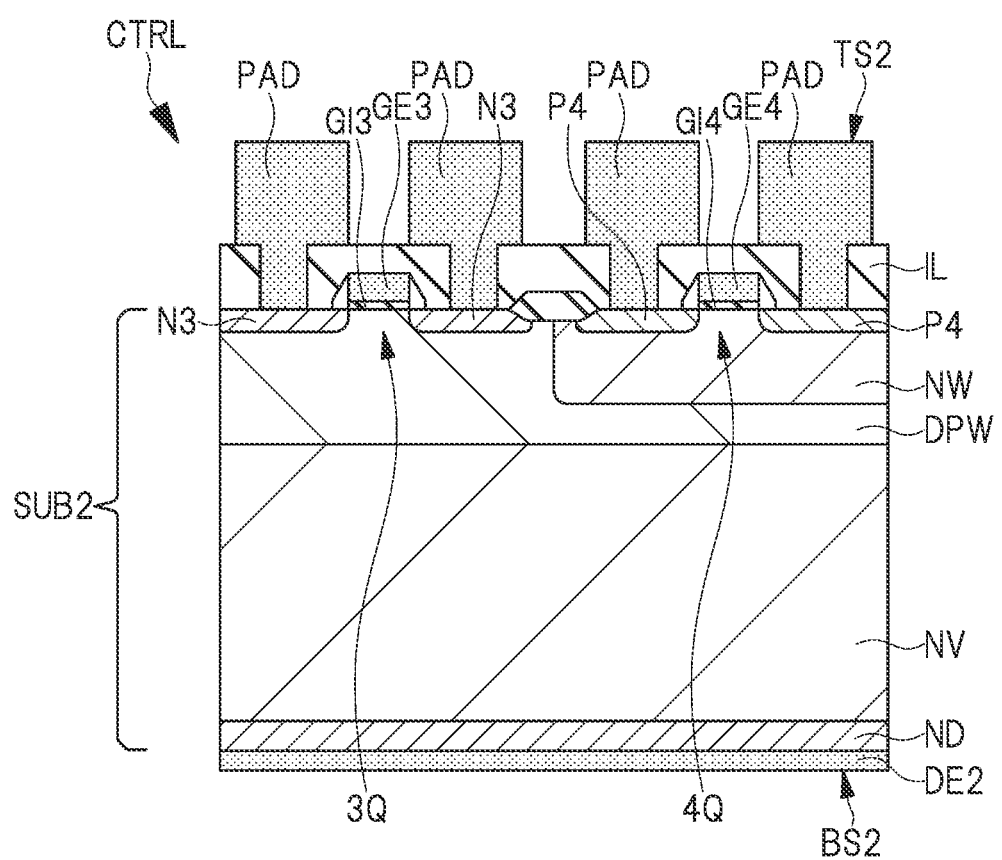
FIG. 18 is a cross-sectional view showing a MOSFET configuring a control circuit according to the third embodiment.

The transistor configuring the control circuit CTRL is, for example, the n-type MOSFET 3Q and the p-type MOSFET 4Q as shown in FIG. 18. Each of the MOSFETs 3Q and 4Q has a planar-type structure. In the region where the MOSFETs 3Q and 4Q are formed, a p-type well region DPW is formed on the semiconductor substrate SUB2, and the MOSFET 2Q is electrically insulated from the MOSFETs 3Q and 4Q by the well region DPW.

The structure of the MOSFET 3Q will be explained. The gate electrode GE3 is formed above the well region DPW via the gate insulating film GI3. In the well region DPW, an n-type diffusion region N3 is formed. The diffusion region N3 configures the source region or the drain region of the MOSFET 3Q.

The structure of the MOSFET 4Q will be explained. An n-type well region NW is formed in the well region DPW where the MOSFET 4Q is formed. The gate electrode GE4 is formed above the well region NW via the gate insulating film GI4. In the well region NW, a p-type diffusion region P4 is formed. The diffusion region P4 configures the source region or the drain region of the MOSFET 4Q.

The MOSFETs 3Q and 4Q are covered with the interlayer insulating film IL, and a plurality of pad electrodes PAD is formed on the interlayer insulating film IL. The plurality of pad electrodes PAD is electrically connected to the gate electrode GE3 and GE4 and the diffusion regions N3 and P4. Note that the plurality of pad electrodes PAD is formed by the same manufacturing steps as those for the source electrode SE2 and the gate wiring GW2, and are made of the same material as those of the source electrode SE2 and the gate wiring GW2.

The MOSFETs 3Q and 4Q, the number of each of which is plural, are formed to configure various circuits such as a CMOS inverter, in cooperation with the plurality of pad electrodes PAD. And, the MOSFETs 3Q and 4Q can be electrically connected to another semiconductor chip, wiring board, electronic apparatus and others through the external connecting member 21 (bonding wire) connected to the plurality of pad electrodes PAD.

In the third embodiment, the gate wiring GW2 includes the connecting portion GW2a and a pad electrode PADg unified with the connecting portion GW2a. The connecting portion GW2a is arranged for the connection to the gate wiring GW1 of the semiconductor chip CHP1 as similar to the first embodiment. The pad electrode PADg is one of the plurality of pad electrodes PAD, and configures a part of the control circuit CTRL. Note that the pad electrode PADg is arranged at a position not overlapping the semiconductor chip CHP1 in plan view.

The gate wiring GW1 is in contact with the connecting portion GW2a of the gate wiring GW2 through the conductive paste 30. In other words, even in the third embodiment, the gate wiring GW1 and the gate wiring GW2 are electrically connected to the control circuit CTRL while being connected to each other. Therefore, the ON/OFF state of the MOSFET 1Q and the ON/OFF state of the MOSFET 2Q can be simultaneously switched. Therefore, the circuit area related to these switching operations can be made half, and thus, the downsizing of the control circuit CTRL can be advanced.

Since the control circuit CTRL is included in the semiconductor chip CHP2, there is no need for the preparation of the semiconductor chip CHP3. Therefore, the manufacture of the semiconductor device 100 can be simplified. And, in the first embodiment, the gate wiring GW1 and the gate wiring GW2 are connected to the control circuit CTRL by the external connecting member 21. In the third embodiment, this connection is achieved by the pad electrode PADg, and therefore, a resistance component related to this connection can be significantly reduced. Therefore, the performance of the semiconductor device 100 can be further improved. And, the loss in the circuit device using the semiconductor device 100 as the switch can be reduced.

Fourth Embodiment

A semiconductor device 100 according to a fourth embodiment will be explained below with reference to FIGS. 19 and 20. In the following explanation, note that differences from the third embodiment will be mainly explained, and explanation for overlapping points with the third embodiment will be omitted.

In the third embodiment, the gate wiring GW1 and the gate wiring GW2 are connected to each other. In the fourth embodiment, the gate wiring GW1 and the gate wiring GW2 are isolated from each other as similar to the second embodiment, and are individually electrically connected to the control circuit CTRL. Therefore, the control circuit CTRL can individually switch the ON/OFF state of the MOSFET 1Q and the ON/OFF state of the MOSFET 2Q.

Figure 19:
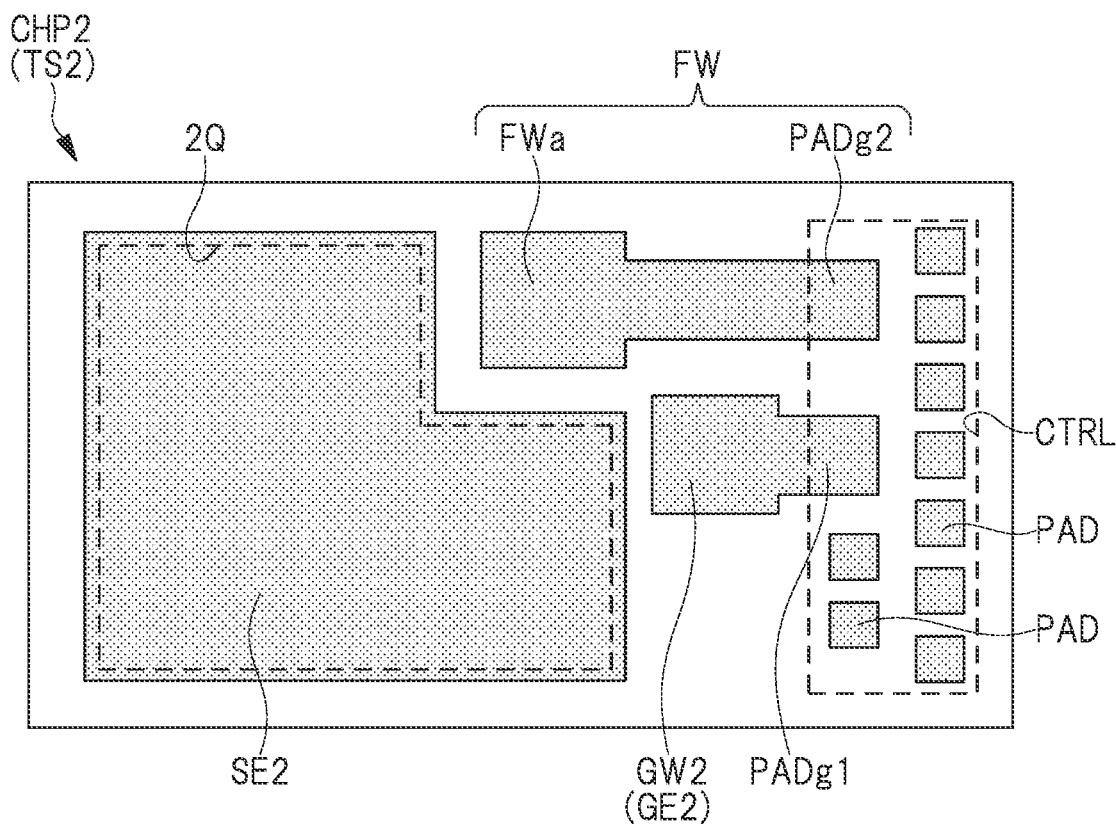
FIG. 19 is a plan view showing the other semiconductor chip according to a fourth embodiment.
Figure 20:
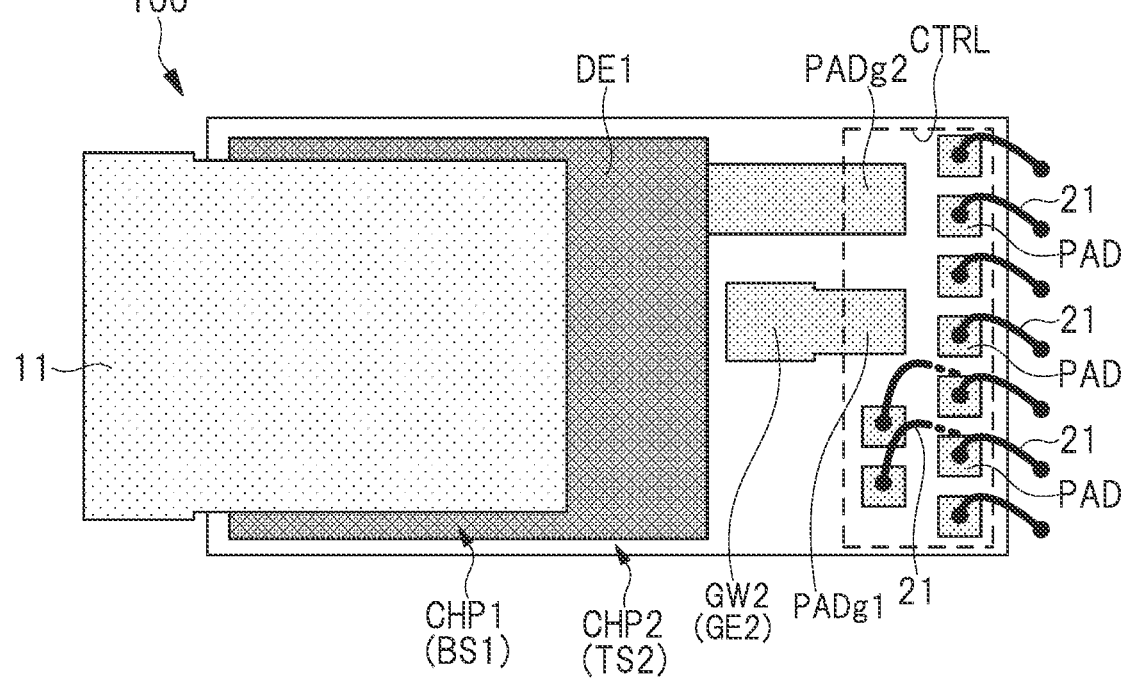
FIG. 20 is a plan view showing a semiconductor device according to the fourth embodiment.

As shown in FIGS. 19 and 20, a wiring FW is formed on the front surface TS2 of the semiconductor chip CHP2. The wiring FW is electrically insulated from the source electrode SE2, the gate wiring GW2 and the drain electrode DE2. Note that the wiring FW is formed by the same manufacturing steps as those for the source electrode SE2 and the gate wiring GW2, and is made of the same material as those of the source electrode SE2 and the gate wiring GW2.

The gate wiring GW2 includes a pad electrode PADg1 unified with the gate wiring GW2. Th gate wiring GW2 is arranged at a position not overlapping the semiconductor chip CHP1 in plan view.

The wiring FW includes a connecting portion FWa and a pad electrode PADg2 unified with the connecting portion FWa. The connecting portion FWa is arranged for the connection to the gate wiring GW1 of the semiconductor chip CHP1. The gate wiring GW1 is in contact with the connecting portion FWa via a conductive member such as the conductive paste 30.

Each of the pad electrodes PADg1 and PADg2 is one of the plurality of pad electrodes PAD, and configures a part of the control circuit CTRL. Note that each of the pad electrodes PADg1 and PADg2 is arranged at a position not overlapping the semiconductor chip CHP1 in plan view.

As described above, the semiconductor device 100 of the fourth embodiment can be favorably used when it is desirable to individually control the ON/OFF state of the MOSFET 1Q and the ON/OFF state of the MOSFET 2Q.

In the fourth embodiment, the wiring FW is used for the connection between the gate wiring GW1 and the control circuit CTRL, and the gate wiring GW2 includes the pad electrode PADg1 that is a part of the control circuit CTRL. Therefore, even in the fourth embodiment, the external connecting member 21 is not used for the connection to the control circuit CTRL as similar to the third embodiment, and thus, a resistance component related to this connection can be significantly reduced. Therefore, the performance of the semiconductor device 100 can be further improved. And, the loss in the circuit device using the semiconductor device 100 as the switch can be reduced.

In the foregoing, the present invention has been concretely described on the basis of the embodiments. However, the present invention is not limited to the foregoing embodiments, and various modifications can be made within the scope of the present invention.

For example, in the above-described embodiments, the case of the usage of the load LAD of the circuit device for the electrical apparatus used in the motor vehicle has been explained. However, the intended use of the circuit device is not limited to the motor vehicle, and the load LAD may be a different electrical apparatus used not in the motor vehicle.

Also, in the above-described embodiments, each of the semiconductor substrates SUB1 and SUB2 has been explained as the n-type silicon substrate. However, the material of each of the semiconductor substrates SUB1 and SUB2 is not limited to silicon, and each of the semiconductor substrates SUB1 and SUB2 may be an n-type silicon carbide substrate (n-type SiC substrate).

Further, in the above-described embodiments, each of the MOSFETs 1Q and 2Q has the trench-gate structure. However, each of the MOSFETs 1Q and 2Q may have the planar structure if the source electrodes SE1 and SE2 and the gate wirings GW1 and GW2 are arranged in the regions close to the front surfaces TS1 and TS2 while the drain electrodes DE1 and DE2 are arranged in the regions close to the back surfaces BS1 and BS2. In other words, the trench TR is not formed, the gate electrodes GE1 and GE2 may be formed above the semiconductor substrates SUB1 and SUB2 via the gate insulating film GI.

What is claimed is:

1. A semiconductor device comprising:
a first semiconductor chip including a first MOSFET of n-type and a first parasitic diode formed in the first MOSFET; and
a second semiconductor chip including a second MOSFET of n-type and a second parasitic diode formed in the second MOSFET,
wherein a first source electrode and a first gate wiring are formed in a front surface of the first semiconductor chip,
wherein a first drain electrode is formed in a back surface of the first semiconductor chip,
wherein a first anode of the first parasitic diode is coupled to the first source electrode, and a first cathode of the first parasitic diode is coupled to the first drain electrode,
wherein a second source electrode and a second gate wiring are formed in a front surface of the second semiconductor chip,
wherein a second drain electrode is formed in a back surface of the second semiconductor chip,
wherein a second anode of the second parasitic diode is coupled to the second source electrode, and a second cathode of the second parasitic diode is coupled to the second drain electrode,
wherein the front surface of the first semiconductor chip and the front surface of the second semiconductor chip face each other such that the first source electrode and the second source electrode come in contact with each other via a first conductive member,
wherein the second semiconductor chip further includes a control circuit electrically connected to the first gate wiring and the second gate wiring, and
wherein the control circuit has a function of supplying a gate potential to each of the first gate wiring and the second gate wiring in order to switch an ON/OFF state of each of the first MOSFET and the second MOSFET.

2. The semiconductor device according to claim 1, wherein the second gate wiring includes:
a first connecting portion; and
a first pad electrode unified with the first connecting portion,
wherein the first gate wiring is in contact with the first connecting portion via a second conductive member,
wherein the first pad electrode is arranged at a position not overlapping the first semiconductor chip in plan view, and configures a part of the control circuit, and
wherein the control circuit simultaneously switches the ON/OFF state of the first MOSFET and the ON/OFF state of the second MOSFET.

3. The semiconductor device according to claim 1,
wherein the second gate wiring is arranged at a position not overlapping the first semiconductor chip in plan view,
wherein the second gate wiring includes a first pad electrode unified with the second gate wiring and configuring a part of the control circuit,
wherein a first wiring that is electrically insulated from the second source electrode, the second gate wiring and the second drain electrode is formed in the front surface of the second semiconductor chip, wherein the first wiring includes a third connecting portion and a second pad electrode unified with the third connecting portion,
wherein the first gate wiring is in contact with the third connecting portion via a third conductive member,
wherein the second pad electrode is arranged at a position not overlapping the first semiconductor chip in plan view, and configures a part of the control circuit, and
wherein the control circuit is allowed to individually switch the ON/OFF state of the first MOSFET and the ON/OFF state of the second MOSFET.

4. The semiconductor device according to claim 1,
wherein the first semiconductor chip includes:
   an n-type first semiconductor substrate having a front surface and a back surface;
   a p-type first body region formed in the first semiconductor substrate in a region close to the front surface of the first semiconductor substrate;
   an n-type first source region formed in the first body region;
   a first trench formed in the first semiconductor substrate in a region close to the front surface of the first semiconductor substrate so that its bottom is at a position that is lower than the first body region;
   a first gate insulating film formed inside the first trench;
   a first gate electrode formed on the first gate insulating film to be buried inside the first trench;
   a first interlayer insulating film formed on the front surface of the first semiconductor substrate;
   the first source electrode formed on the first interlayer insulating film and electrically connected to the first body region and the first source region;
   the first gate wiring formed on the first interlayer insulating film and electrically connected to the first gate electrode;
   an n-type first drain region formed in the first semiconductor substrate in a region close to the back surface of the first semiconductor substrate; and
   the first drain electrode formed below the back surface of the first semiconductor substrate and electrically connected to the first drain region,
wherein the second semiconductor chip includes:
   an n-type second semiconductor substrate having a front surface and a back surface;
   a p-type second body region formed in the second semiconductor substrate in a region close to the front surface of the second semiconductor substrate;
   an n-type second source region formed in the second body region;
   a second trench formed in the second semiconductor substrate in a region close to the front surface of the second semiconductor substrate so that its bottom is at a position that is lower than the second body region;
   a second gate insulating film formed inside the second trench;
   a second gate electrode formed on the second gate insulating film to be buried inside the second trench;
   a second interlayer insulating film formed on the front surface of the second semiconductor substrate;
   the second source electrode formed on the second interlayer insulating film and electrically connected to the second body region and the second source region;
   the second gate wiring formed on the second interlayer insulating film and electrically connected to the second gate electrode;
   an n-type second drain region formed in the second semiconductor substrate in a region close to the back surface of the second semiconductor substrate; and
   the second drain electrode formed below the back surface of the second semiconductor substrate and electrically connected to the second drain region,
wherein the first parasitic diode is made of the first body region and the first semiconductor substrate and the first drain region below the first body region, and
wherein the second parasitic diode is made of the second body region and the second semiconductor substrate and the second drain region below the second body region.

5. The semiconductor device according to claim 4, wherein the second semiconductor chip further includes a p-type column region formed in the second semiconductor substrate below the second body region.

6. A circuit device using the semiconductor device according to claim 1 as a switch, comprising:
   a battery having a positive electrode and a negative electrode; and
   a load,
   wherein the second drain electrode is electrically connected to the positive electrode, and
   wherein the first drain electrode is electrically connected to the negative electrode through the load.

7. A circuit device using the semiconductor device according to claim 5 as a switch, comprising:
   a battery having a positive electrode and a negative electrode; and
   a load,
   wherein the second drain electrode is electrically connected to the positive electrode, and
   wherein the first drain electrode is electrically connected to the negative electrode through the load.

8. A semiconductor device comprising:
   a first semiconductor chip including a first MOSFET of n-type and a first parasitic diode formed in the first MOSFET; and
   a second semiconductor chip including a second MOSFET of n-type and a second parasitic diode formed in the second MOSFET,
   wherein a first source electrode and a first gate wiring are formed in a front surface of the first semiconductor chip,
   wherein a first drain electrode is formed in a back surface of the first semiconductor chip,
   wherein a first anode of the first parasitic diode is coupled to the first source electrode, and a first cathode of the first parasitic diode is coupled to the first drain electrode,
   wherein a second source electrode and a second gate wiring are formed in a front surface of the second semiconductor chip,
   wherein a second drain electrode is formed in a back surface of the second semiconductor chip,
   wherein a second anode of the second parasitic diode is coupled to the second source electrode, and a second cathode of the second parasitic diode is coupled to the second drain electrode,
   wherein the front surface of the first semiconductor chip and the front surface of the second semiconductor chip face each other such that the first source electrode and the second source electrode come in contact with each other via a first conductive member, wherein the semiconductor device further includes a third semiconductor chip including a control circuit electrically connected to each of the first gate wiring and the second gate wiring,
wherein the control circuit has a function of supplying a gate potential to the first gate wiring and the second gate wiring in order to switch an ON/OFF state of each of the first MOSFET and the second MOSFET.

9. The semiconductor device according to claim 8, wherein the second gate wiring includes:
a first connecting portion; and
a second connecting portion unified with the first connecting portion,
wherein the first gate wiring is in contact with the first connecting portion via a second conductive member,
wherein the second connecting portion is arranged at a position not overlapping the first semiconductor chip in plan view, and is electrically connected to the control circuit through a first external connecting member, and
wherein the control circuit simultaneously switches the ON/OFF state of the first MOSFET and the ON/OFF state of the second MOSFET.

10. The semiconductor device according to claim 8, wherein the second gate wiring is arranged at a position not overlapping the first semiconductor chip in plan view, and is electrically connected to the control circuit through a second external connecting member,
wherein a first wiring that is electrically insulated from the second source electrode, the second gate wiring and the second drain electrode is formed in the front surface of the second semiconductor chip,
wherein the first wiring includes:
a third connecting portion; and
a fourth connecting portion unified with the third connecting portion,
wherein the first gate wiring is in contact with the third connecting portion via a third conductive member,
wherein the fourth connecting portion is arranged at a position not overlapping the first semiconductor chip in plan view, and is electrically connected to the control circuit through a third external connecting member, and
wherein the control circuit is allowed to individually switch the ON/OFF state of the first MOSFET and the ON/OFF state of the second MOSFET.

11. The semiconductor device according to claim 8, wherein the first semiconductor chip includes:
an n-type first semiconductor substrate having a front surface and a back surface;
a p-type first body region formed in the first semiconductor substrate in a region close to the front surface of the first semiconductor substrate;
an n-type first source region formed in the first body region;
a first trench formed in the first semiconductor substrate in a region close to the front surface of the first semiconductor substrate so that its bottom is at a position that is lower than the first body region;
a first gate insulating film formed inside the first trench;
a first gate electrode formed on the first gate insulating film to be buried inside the first trench;
a first interlayer insulating film formed on the front surface of the first semiconductor substrate;
the first source electrode formed on the first interlayer insulating film and electrically connected to the first body region and the first source region;
the first gate wiring formed on the first interlayer insulating film and electrically connected to the first gate electrode;
an n-type first drain region formed in the first semiconductor substrate in a region close to the back surface of the first semiconductor substrate; and
the first drain electrode formed below the back surface of the first semiconductor substrate and electrically connected to the first drain region,
wherein the second semiconductor chip includes:
an n-type second semiconductor substrate having a front surface and a back surface;
a p-type second body region formed in the second semiconductor substrate in a region close to the front surface of the second semiconductor substrate;
an n-type second source region formed in the second body region;
a second trench formed in the second semiconductor substrate in a region close to the front surface of the second semiconductor substrate so that its bottom is at a position that is lower than the second body region;
a second gate insulating film formed inside the second trench;
a second gate electrode formed on the second gate insulating film to be buried inside the second trench;
a second interlayer insulating film formed on the front surface of the second semiconductor substrate;
the second source electrode formed on the second interlayer insulating film and electrically connected to the second body region and the second source region;
the second gate wiring formed on the second interlayer insulating film and electrically connected to the second gate electrode;
an n-type second drain region formed in the second semiconductor substrate in a region close to the back surface of the second semiconductor substrate; and
the second drain electrode formed below the back surface of the second semiconductor substrate and electrically connected to the second drain region,
wherein the first parasitic diode is made of the first body region and the first semiconductor substrate and the first drain region below the first body region, and
wherein the second parasitic diode is made of the second body region and the second semiconductor substrate and the second drain region below the second body region.

12. The semiconductor device according to claim 11, wherein the second semiconductor chip further includes a p-type column region formed in the second semiconductor substrate below the second body region.

13. A circuit device using the semiconductor device according to claim 8 as a switch, comprising:
a battery having a positive electrode and a negative electrode; and
a load,
wherein the second drain electrode is electrically connected to the positive electrode, and
wherein the first drain electrode is electrically connected to the negative electrode through the load.

14. A circuit device using the semiconductor device according to claim 12 as a switch, comprising:
a battery having a positive electrode and a negative electrode; and
a load, wherein the second drain electrode is electrically connected to the positive electrode, and wherein the first drain electrode is electrically connected to the negative electrode through the load.

\* \* \* \* \*